United States Patent [19]

Bruun et al.

[11] 4,150,272

[45] Apr. 17, 1979

[54] PUSH BUTTON CONTACT MECHANISM FOR USE AT PRINTED CIRCUIT CARDS

[75] Inventors: Jan F. Bruun; Peter S. E. Sommansson, both of Tyresö, Sweden

[73] Assignee: Telefonaktiebolaget L M Ericsson, Stockholm, Sweden

[21] Appl. No.: 855,220

[22] Filed: Nov. 28, 1977

[30] Foreign Application Priority Data

Dec. 21, 1976 [SE] Sweden ................................ 7614333

[51] Int. Cl.[2] .......................... H01H 3/12; H05K 1/04

[52] U.S. Cl. .................................. 200/159 A; 200/292

[58] Field of Search .......... 200/67 D, 67 DA, 67 DB, 200/159 A, 292

[56] References Cited

U.S. PATENT DOCUMENTS

| | | | |
|---|---|---|---|
| 3,392,250 | 7/1968 | Ziegler et al. | 200/159 A |
| 3,433,914 | 3/1969 | Ericsson | 200/159 A |
| 3,870,840 | 3/1975 | Rivetta et al. | 200/159 A X |
| 3,924,090 | 12/1975 | Chao et al. | 200/159 A |
| 3,996,429 | 12/1976 | Chu et al. | 200/159 A X |

*Primary Examiner*—Herbert F. Ross

*Attorney, Agent, or Firm*—Hane, Roberts, Spiecens & Cohen

[57] ABSTRACT

The invention relates to a contact mechanism suitable for application to printed circuits arranged on a board and may by employed in a telephone set comprising push button means. The mechanism consists of a first contact member in the form of a leaf spring having two legs and between these a tongue part, the middle portion of which has an inwardly curved bent part and the lower portion of which has two narrow taps carrying the contact elements. The first contact member is placed in upright position along a groove in a bottom plate. A second contact member consists of a small T-shaped metal plate which is fastened oppositely to said taps in a notch of the groove and carries a contact element. The contact mechanism is actuated when a button is depressed, whereby a curved part of the button engages the bent part and forces the tongue part to move into contact with the second contact member.

6 Claims, 9 Drawing Figures

PUSH BUTTON CONTACT MECHANISM FOR USE AT PRINTED CIRCUIT CARDS

BACKGROUND OF THE INVENTION

The present invention relates to a push button contact mechanism intended for use at so called printed circuits provided on thin boards. Such push button contact mechanisms are used, for example, in push button sets as key senders for telephone sets. These push button sets, which are intended to replace the conventional dial, must not be bulky and the construction of the contact mechanism, therefore, presents a problem, especially as the space available for the contact springs is limited.

In a known construction according to the Swedish Pat. No. 223 147, contact springs are used which are located on supports projecting from the circuit board and which have movable contact ends arranged substantially perpendicular to the board. This construction of the contact springs has the advantage that the flexible length of the spring when actuated can be made greater without the spring occupying substantially greater space. The drawback with this construction of the contact springs is, however, that the manufacture and the mounting can be detailed and unnecessarily complicated since the contact springs are formed as coil springs.

SUMMARY OF THE INVENTION

The object of the present invention is to provide a push button contact mechanism in which the contact springs upon action show a greater flexible length, whereby space can be saved together with a simplification of the manufacture of the spring.

BRIEF DESCRIPTION OF THE DRAWING

The invention will be described more fully with reference to the accompanying drawings, in which.

DETAILED DESCRIPTION OF THE INVENTION

Figure 1:
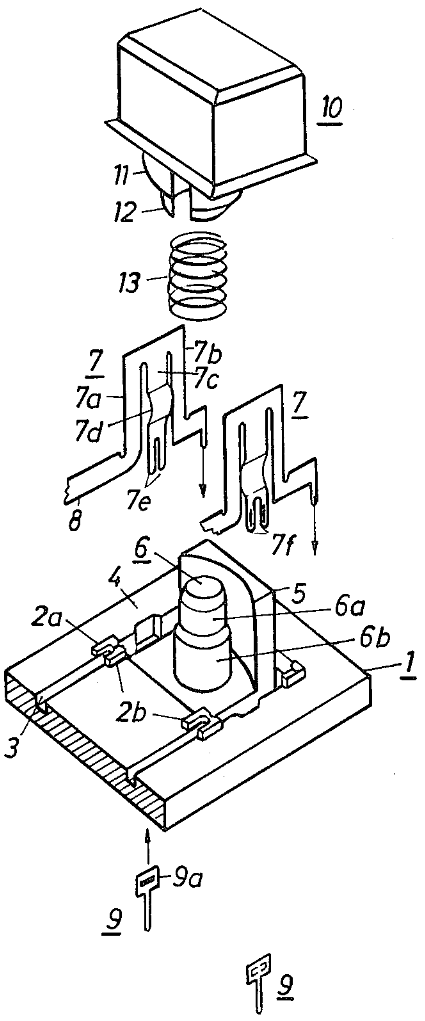
FIG. 1 shows an exploded view of a switching portion of the push button contact mechanism according to the invention.

In the exploded view according to FIG. 1, a base plate 1 of insulating material is shown, for example plastic which carries a push button contact mechanism. The base plate can be common for a number of push button contact mechanisms, for example a line of four. A push button 10 is provided at its central axis with a hollow cylindrical part 12 to be displaced downwards around the broader part 6*b* of cylindrical post 6 which is moulded on a depressed plane part of the base plate 1. A guide 5 is moulded closely to the post 6. A helical spring 13 is so dimensioned that it can be threaded into the hollow cylindrical part 12 and bear against the plane part between the narrower part 6*a* and the broader part 6*b* of the post 6. Also at the central axis of the button 10, an enlarged part 11 for actuating the contact springs is provided. The enlarged part is preferably formed as a curve, whereby insensitivity against turning of the push button is obtained. In its non-actuated position, the push button 10 is guided laterally by the cover plate of the key set (not shown). When actuated, the position of the button 10 is, at the beginning fixed by means of the guide 5 and upon continued actuation, the guiding is taken over by the post 6 in such a way that the inner envelope surface 12 slides against the broader part 6*b* of the post 6. When the button 10 has been completely pushed down, the part 12 will abut against the depressed part of the base plate. The helical spring 13 is then in its compressed position by its bearing against the plane part of the post 6 and, therefore, when the pushing actuation ceases, the button 10 will, by spring action, return to its starting position.

The contact springs 7 are, as it appears from FIG. 1, manufactured as leaf springs, a contact spring 7 being connected with adjacently situated contact spring by means of a strip 8. Each of the contact springs consists of two legs 7*a*, 7*b* and a central tongue part 7*c* connected between the two legs. The middle portion of the tongue part is formed as an inwardly curved bent part 7*d* and the lower portion of the part consists of two smaller tongues 7*e*, which each at their lower portion carries a contact 7*f* intended to cooperate with a fixed contact 9*a* on a contact sheet 9 provided in the notch 4 on the base plate 1.

As it is shown by the arrows, each of the contact springs 7 is pushed down into the base plate 1 in such a way that the strip 8 between two adjacent contact springs falls along the groove 3 and the lower portion of the legs are jammed between two guide elements 2*a*, 2*b*, the tongues 7*e* being situated right in front of the notch 4. The contact springs are placed towards each other so that one bent part 7*d* faces the other. The contact sheet 9 consists of a broader portion on which a contact 9*a* is provided and a long and narrow portion which constitutes a soldering tag when the base plate is to be soldered on an underlying circuit card.

Figure 2:
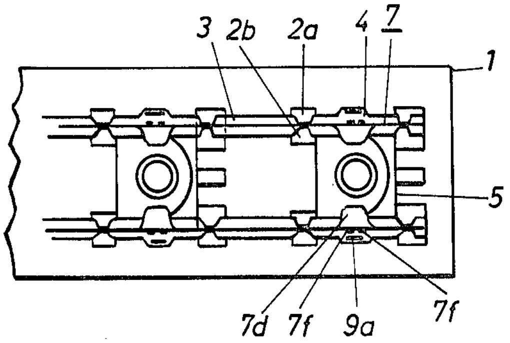
FIG. 2 shows in a top view part of the contact mechanism according to the invention in which the contact spring is in the mounted position.
Figure 3:
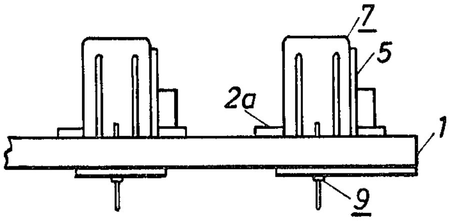
FIG. 3 shows the same part as in FIG. 2 seen from the side.

FIGS. 2 and 3 show in a top view and from the side the base plate 1 when the contact springs, combined by means of the strips 8, and the contact sheets 9 are mounted in a longitudinal groove 3 of the base plate and in notches 4, respectively.

Figure 4:
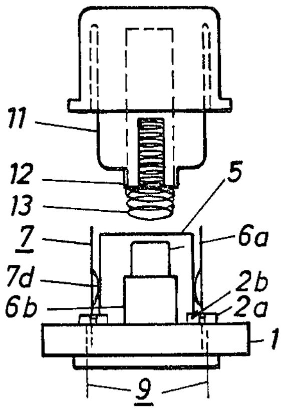
FIG. 4 shows the same part as in FIG. 2 seen from the front and in addition a push button.

In FIG. 4, in a front view, the base plate 1 is shown with mounted contact springs and contact sheets together with the push button 10 and helical spring 13. The inner outline of the hollow cylindrical part 12 is indicated by the dotted lines which define the space for the spring 13. The bent part 7*d* of the tongue part 7*c* of the contact spring serves as an actuation surface for the actuation element (push button) and the part 7*c* as well as the legs 7*a*, 7*b* will when infuenced, be forced outwards, the contacts 7*f* on the smaller tongues 7*e* thereby making contact with the contact sheet 9 in the notch 4. The actuation means is constituted by the curved portion of the enlarged part 11. The process at actuation will now be described more fully according to FIGS. 5*a*–5*c*.

Figure 5A:
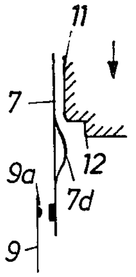
FIG. 5*a–c* show the positions of the contact springs at three different phases of the push button movement.
Figure 5B:
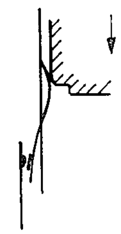
Figure 5C:
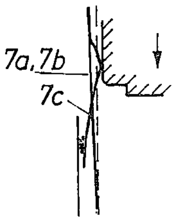

FIGS. 5*a*–5*c* show three different phases when pushing down a button. In the phase according to FIG. 5*a*, the button 10 has been pushed down a bit so that the curved portion of the enlarged part 11 of the button is situated close to the bent part *7d* of the tongue *7c* of the contact spring, but no force on the spring 7 has yet occurred. In the phase according to FIG. 5*b*, the curved portion has touched the bent part *7d* and thereby has started to force the tongue *7c* to spring a bit outwards, but the influence of the contact spring is not yet such that the two legs *7a, 7b* have started to spring outwards. The contact profiles *7f* of the contact spring 7 and the contact sheet 9 have not yet come into contact with each other. In the phase according to FIG. 5*c*, the push button has been pressed so that the envelope surface of the enlarged part 11 slides against the bent part *7d* and also the two legs *7a, 7b* of the contact spring 7 spring outwards. Thus, by making both the tongue *7c* and the legs *7a, 7b* to spring outwards, a double spring action of the contact spring 7 is obtained. The contact profiles now contact each other, but just at the beginning of the contacting the contact profiles *7f* and *9a* will, during a small time interval, slide against each other, and for that reason eventual oxidation on these parts can be removed. In FIGS. *5a–5c*, for the sake of simplicity, the different phases are shown only for a pair of contact springs-contact sheets, but it is understood that the same process will occur at the opposite situated pair on the base plate 1.

Figure 6:
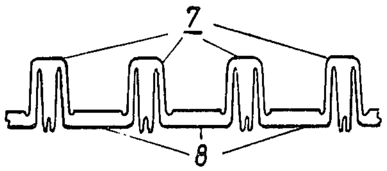
FIG. 6 shows a set of contact springs according to FIG. 1; separately.
Figure 7:
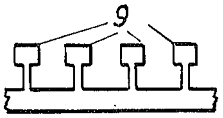
FIG. 7 shows a set of contact sheets separately included in the contact mechanism according to the invention.

The contact springs are manufactured from endless strips from which a desired number of combined contact springs are stamped and, being connected together, are mounted on the base plate 1 included in the push button set. FIG. 6 shows a set of such connected contact springs, for the FIG. 4 pieces intended to be included in a push button set which consists of 3×4=12 buttons. In FIG. 7, four contact sheets 9 are shown stamped from a strip, the sheets of which in connection with the mounting on the base plate may be cut to obtain individual sheets as shown in FIG. 1. The contact profiles *7f, 9a* consist of, for example, cut gold wire, the wire being mounted on the contact spring along the two taps *7e* on smaller tongues *7e* of the tongue *7c* and horizontally on the upper part of the contact sheet 9. The contact springs and the contact sheets may be individual or may be connected along the base plate. The contact sheets as well as the contact springs are, during the mounting, combined in strips, whereby it is achieved that the same automatic mounting principle can be used.

The proposed design of the contact springs and contact sheets gives the advantage that the spring as regards spring action is twice as long as allowed by the space, which implies lower stress on the spring compared with a single spring. Furthermore, greater contact sliding is obtained owing to the design. The complete mounted base plate can, by means of the contact sheets formed as soldering tags, be soldered directly on an underlying circuit card.

We claim:

1. A push button contact mechanism for use at a printed circuit board, comprising: a base plate having a pair of parallel grooves formed on the top surface thereof, the walls forming said pair of grooves being electrically connected to the printed circuit, said base plate further comprising a recessed portion between said pair of grooves, a pair of opposed guide elements in each groove adjacent said recessed portions, a post mounted perpendicularly to said base plate and in said recessed portion, and a guide member also mounted perpendicularly to said base plate and in said recessed portion and extending between said grooves and in close proximity to said post; a pair of contact springs, each of said pair of contact springs including a first leg, a second leg, and a tongue part between said first and second legs, said tongue part and said first and second legs being parallel to one another when the push button contact mechanism is in its non-actuated position, said pair of contact springs being mounted between said pair of guide elements in each said pair of grooves of said base plate, and said tongue part comprising an inwardly curved bent portion along the center thereof and curved toward said post and also having a free end, said free end having at least one contact profile thereon; and a push button actuating member supported by said guide member for axial movement therealong and toward said base plate and said contact springs said actuating member comprising a stepped enlarged part for engaging said inwardly curved bent portions of said pair of contact springs to force said at least one contact profile of said free end of each of said tongue parts into engagement with that portion of said walls of said pair of grooves that is electrically connected to the printed circuit.

2. The push button contact mechanism according to claim 1, wherein each of said pair of grooves includes a notch formed in one wall surface of the respective groove, and said base plate further comprises a pair of contact sheets, said pair of contact sheets being mounted in said pair of grooves at the respective notches to thereby constitute the electrical connection between said base plate and the printed circuit.

3. The push button contact mechanism according to claim 2, wherein said free end of each tongue of said pair of contact springs comprises a first pair of contact profiles, and each of said pair of contact sheets also comprises a second pair of contact profiles for engagement with said first pair of contact profiles.

4. The push button contact mechanism according to claim 1, wherein said tongue part of each of said pair of contact springs is spaced from said first and second legs and positioned therebetween.

5. The push button contact mechanism according to claim 4, wherein each of said pair of contact springs further comprises a first connecting portion connected to that end of said first leg not connected to said tongue part, and a second connecting portion connected to that end of said second leg not connected to said tongue part, each of said pair of grooves having means for mounting said first and second connecting portions therein so that said at least one contact profile of each free end is positioned adjacent to and in front of a respective one of said pair of contact sheets.

6. The push button contact mechanism according to claim 1, wherein said tongue part has a length in excess of said first and second legs whereby said free end extends beyond the ends of said first and second legs not connected to said tongue part in a plane connecting said ends of said first and second legs not connected to said tongue part.

* * * * *